United States Patent [19]

Inoue

[11] Patent Number: 5,151,770
[45] Date of Patent: Sep. 29, 1992

[54] SHIELDED SEMICONDUCTOR DEVICE

[75] Inventor: Akira Inoue, Itami, Japan

[73] Assignee: Mitsubishi Denki Kabushiki Kaisha, Tokyo, Japan

[21] Appl. No.: 616,366

[22] Filed: Nov. 21, 1990

[30] Foreign Application Priority Data

Nov. 24, 1989 [JP] Japan ................................. 1-305125

[51] Int. Cl.⁵ .................... H01L 29/40; H01L 23/48; H01L 29/46; H01L 25/04
[52] U.S. Cl. ........................................ 357/53; 357/71; 357/84
[58] Field of Search ...................... 357/23.6, 53, 71, 84

[56] References Cited

U.S. PATENT DOCUMENTS

| 3,754,170 | 8/1973 | Tsuda et al. ........................ 317/235 |
| 4,477,736 | 10/1984 | Onishi .................................. 357/23.6 |
| 4,494,217 | 1/1985 | Suzuki et al. ...................... 357/23.1 |
| 4,599,680 | 7/1986 | Gibson et al. ...................... 357/81 |
| 4,729,063 | 3/1988 | Matsuo et al. ...................... 357/71 |
| 4,958,222 | 9/1990 | Takakura et al. ................... 357/71 |

FOREIGN PATENT DOCUMENTS 58-52854 3/1983 Japan ..................................... 357/71
63-143856 6/1988 Japan .

OTHER PUBLICATIONS

D. R. Tomsa et al., "Multilayer laminated chip carrier", *IBM Technical Disclosure Bulletin*, vol. 21 (Sep. 1978) pp. 1396-1397.

*Primary Examiner*—J. Carroll
*Attorney, Agent, or Firm*—Leydig, Voit & Mayer

[57] ABSTRACT

A semiconductor device operable in the microwave frequency range and including a shielding means isolating one integrated circuit (or group of integrated circuits) on the substrate from others. The shielding means is formed by integrated circuit manufacturing techniques, and avoids the necessity for assembling separate integrated circuit chips on a metallic shielding member. An insulator film is formed on the substrate overlying the integrated circuits. Conductive shielding means are embedded in the insulating film to define a line separating the integrated circuits to be shielded. The shielding means has a spacing density and height above the substrate adapted to block electromagnetic radiation between the integrated circuits. An effective ground is applied to the shielding means so that it performs its isolation function.

9 Claims, 4 Drawing Sheets

SHIELDED SEMICONDUCTOR DEVICE

FIELD OF THE INVENTION

This invention relates to semiconductor devices and more particularly to high frequency integrated circuits such as those capable of operating in the microwave frequency range.

BACKGROUND OF THE INVENTION

The term "high frequency" is used herein to refer to operating frequencies at which electromagnetic radiation and electromagnetic interference between proximate circuits becomes a problem. As an example, many microwave circuits are configured to operate at about 30 gHz.., and that frequency represents a useful application of the present invention. In many of its aspects, the invention can be considered to be broadly useful in the high frequency range from about 800 mHz. to 100 gHz..

In many cases, in such high frequency devices, it is necessary to isolate a given integrated circuit (or group of circuits) from others so that the circuits will not interfere with each other. The electromagnetic radiation which passes from one circuit to the other in the form of electromagnetic interference, can serve as an unwanted feedback path. One of the results can be the creation of unwanted oscillations in the circuit. Another can be the alteration of device characteristics from a desired characteristic intended by the designer to an entirely different characteristic for the circuit operating with the unanticipated feedback path. The nature of the feedback path is very affected by the operating frequency of the device, the nature of the coupling, the presence of adjacent conductors, improperly designed shielding devices, and the like. In some cases, such as when the size of the cavities in which the integrated circuits are mounted is greater than one-half wavelength, unwanted resonances can be generated near the working frequency due to cavity resonance.

Figure 6:
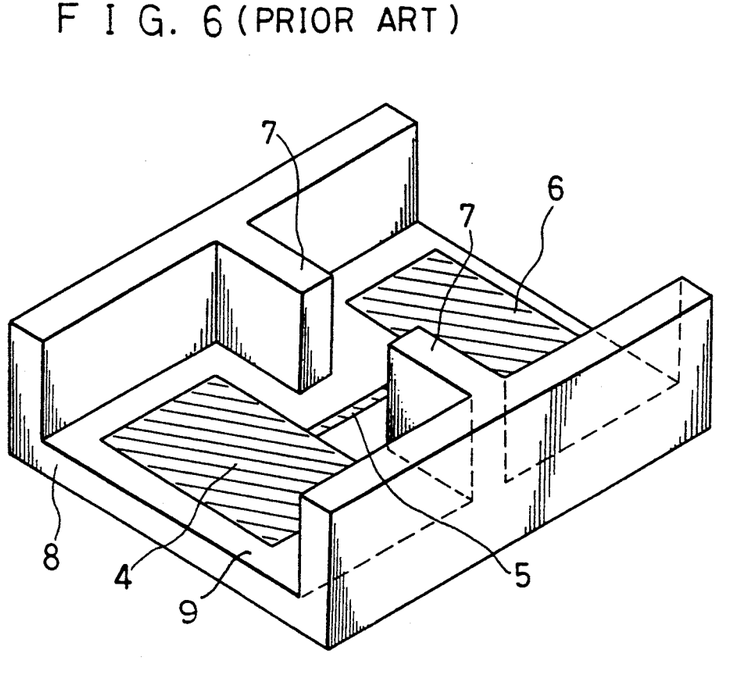
FIG. 6 is a perspective view illustrating a prior art structure with semiconductor devices mounted on a shielding support.

FIG. 6 illustrates in perspective a conventional semiconductor device, sometimes known as a modular structure, designed to alleviate some of the foregoing problems. Integrated circuits 4 and 6 are illustrated as two circuit elements which are intended to be isolated. The circuits are electrically interconnected by a conductor 5. In the illustrated embodiment, each of the circuits 4, 6 is formed on its own substrate. Even if the circuits were originally formed on the same wafer, in order to be used in the configuration of FIG. 6, they are required to be diced or otherwise separated for individual mounting.

In order to provide shielding between the integrated circuits 4, 6 a shielding circuit mount 8 is provided having a pair of upstanding walls 7 interposed between the circuits 4, 6 and rising a substantial distance above the plane 9 of the substrate 8 on which the integrated circuits are mounted. The substrate 8 is formed of conductive metal, typically copper or copper-plated tungsten, and is adapted to provide a ground plane under the circuits 4, 6 and intermediate shields 7 separating those circuits, but leaving a narrow passage for the conductor 5. The integrated circuit chips 4, 6 as well as the conductor 5 are bonded to the substrate 8 as by solder, a conductive adhesive material or the like.

The walls 7 typically range in height from about 0.01 to about 0.1 wavelengths of the operating frequency of the circuit. With that dimension of height, and maintaining the channel between the walls 7 narrow but adequate for passage of the conductor 5. substantial shielding is provided between the circuits 4, 6. However, that shielding is achieved at the cost of assembly procedures, and an increase in size of the completed device. With respect to size, it is clear that the mounting substrate must be large and strong enough to tolerate the manipulative assembly techniques, and that the walls 7 must be sufficiently thick to be self-supporting.

More particularly, in order to use the shielding substrate 8 as shown in FIG. 6, the integrated circuits 4, 6 must be formed on separate substrates, must be assembled onto the substrate, and the conductor 5 must also be arranged on the substrate and interconnected to the respective semiconductors in order to provide a completed assembly. Since a metallic conductive body 8 is used it is difficult to achieve the desired size and weight reduction for the semiconductor device, and the aforementioned assembly procedures also serve to increase cost.

Figure 7:
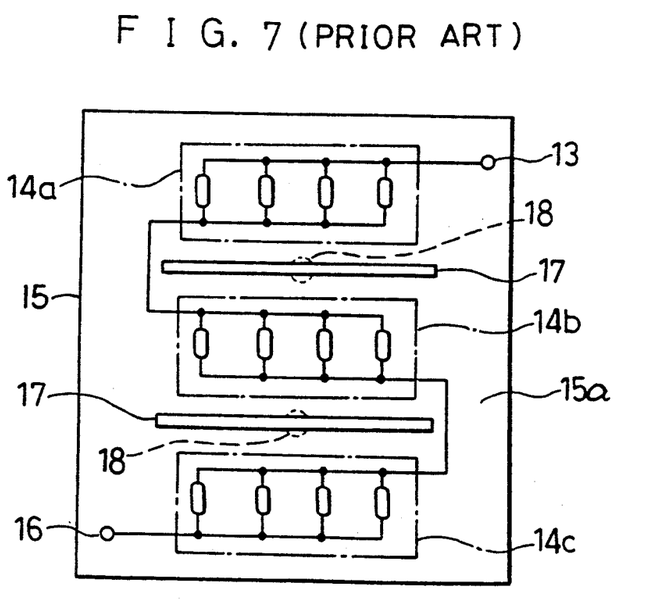
FIG. 7 is a plan view illustrating a semiconductor device with surface mounted shielding means interposed between groups of semiconductor circuits.

FIG. 7 illustrates another prior art approach as described in Japanese published patent specification No. 63-143856. FIG. 7 shows a plurality of serially connected distributed amplifiers 14a, 14b, 14c, each having a plurality of active elements arranged in multiple rows on a planar surface 15a of a semi-insulating substrate 15. An input terminal 16 feeds the first group of active elements 14c which then drive in cascade the remaining groups 14b, 14a to drive an output terminal 13. Thus, a microwave signal interposed on input terminal 16 is amplified and reproduced at output terminal 13.

In order to provide a measure of shielding between the groups of amplifiers 14a, 14b, 14c, grounded wiring patterns 17 are formed on the surface 15a of the substrate and grounded by means of vias 18. The vias 18 penetrate the substrate 15 and are filled with conductive metal, forming a connection to a ground plane to maintain the surface deposited conductors 17 at a ground potential. However, the thickness of the conductors 17 is typically only about 2 microns, and therefore such conductors are not highly effective in performing a shielding function for electromagnetic radiation. While the surface mounted shields 17 might be effective for interference which would otherwise propagate along the surface of the substrate, the height of the shields limits any substantial effect on the very significant EMI radiated in the air paths over the shields. Such radiation, in effect, provides an unwanted feedback path between the groups of amplifiers 14a, 14b, 14c.

The effect of that feedback path can be significant as will now be shown. It is known that electromagnetic energy of microwave frequency which propagates from a driving circuit to another circuit travels not only along the surface on which the circuits are mounted, but also in the space surrounding the circuits. It is believed that about 80% of the energy is propagated in the space other than on the substrate surface. Therefore, it will be appreciated that while surface mounted conductors 17 are adequate to block surface traveling interference, the majority of the energy, i.e., that propagated in the space surrounding the circuit, remains substantially unaffected. The limitations of this shielding technique will therefore be apparent.

SUMMARY OF THE INVENTION

In view of the foregoing, it is a general aim of the present invention to provide a semiconductor device including shielded integrated circuits formed on a single substrate but which is highly efficient in shielding one integrated circuit (or group of integrated circuits) on the substrate from another.

It is a more specific object to achieve substantial shielding between two microwave integrated circuits at least as effectively as has been achieved using conductive metal shielding mounts, but while avoiding the expense and inconvenience of using separate conductive metal shields, separate integrated circuit dice, assembly procedures and the like.

Thus, in accordance with the invention, there is provided a semiconductor device comprising a single substrate, with at least two high frequency integrated circuits formed on a planar surface of the substrate and adapted for operation in the microwave frequency range. An insulator film is formed on the substrate overlying the integrated circuits. Shielding means is embedded in the insulating film in an orientation substantially normal to the surface of the substrate. The shielding means is disposed between the two semiconductors (or groups of semiconductors) which are to be shielded from each other. The shielding means has a spacing density and height above the substrate adapted to block electromagnetic radiation between the circuits. An effective ground is applied to the shielding means to create the desired isolation.

In one embodiment of the invention, the shielding means comprises a group of upstanding pin-like conductors embedded in the insulator film and spaced at a distance which is substantially less than a wavelength of the microwave frequency at which the circuit operates. In another embodiment, the shielding means comprises an elongate blade-like structure in which the width of the blade is perpendicular to the surface of the substrate.

It is a feature of the invention that the semiconductor device can be formed on a single substrate, and conventional semiconductor processing techniques used to provide not only the integrated circuit devices, but also the shielding means which isolates one device or group of devices from another. Thus, it is a feature of the invention that the semiconductor device can be miniaturized and can dispense with the need for bulky shields on which individual circuits are mounted as well as the assembly techniques which are required when using such shields.

A further feature of the invention is the provision of an effective shielding structure which does not introduce the danger of cavity resonance.

In a further embodiment of the invention, a multiple layer device is provided in which multiple layers of insulating film are formed to overlie the integrated circuits above the surface of the substrate, with pin-like conductive structures being arranged in the respective layers of the film and interconnected by conductors interposed between layers of the insulating film.

Other objects and advantages will become apparent from the following detailed description when taken in conjunction with the drawings, in which:

While the invention will be described in connection with certain preferred embodiments, there is no intent to limit it to those embodiments. On the contrary, the intent is to cover all alternatives, modifications and equivalents included within the spirit and scope of the invention as defined by the appended claims.

DETAILED DESCRIPTION OF THE PREFERRED EMBODIMENTS

Figure 1:
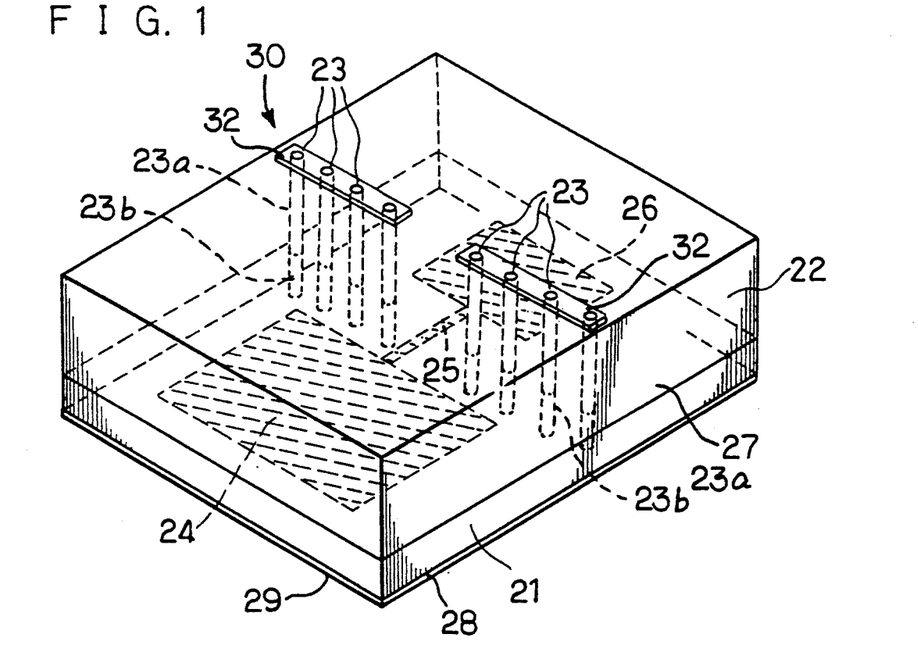
FIG. 1 is a perspective view showing a semiconductor device constructed in accordance with a first embodiment of the present invention.

Turning now to the drawings, FIG. 1 shows a semiconductor device operable at microwave frequencies which exemplifies the present invention. A conventional semiconductor substrate 21 such as GaAs serves as the base for the circuit. Conventional integrated circuits 24, 26 are formed on the substrate 21 by the ordinary processing techniques such as ion implantation, diffusion, photo lithography, epitaxial growth and the like. The formation of the circuits 24, 26 will not be described in detail herein since their structure is conventional. A conductor 25 is also deposited, as by plating and liftoff in order to connect particular devices in the integrated circuits 24, 26. The circuits 24, 26 represent microwave circuitry which can include amplifiers, an oscillator or the like operating in the microwave frequency band.

In the embodiment of FIG. 1, the circuits 24, 26 are to be isolated from each other insofar as electromagnetic radiation is concerned. Thus, the circuits are slightly separated in order to allow adequate space for a linear shield generally indicated at 30 interposed between the circuits 24, 26. In the FIG. 1 embodiment, the shield 30 comprises a plurality of upstanding pin-like conductors 23 which rise above the upper surface 27 of the substrate on which the semiconductors 24, 26 are formed.

In practicing the invention, the linear shield 30 comprising the pin-like conductive structures 23 is not arranged to be solely self-supporting, but is formed of a plurality of thin metallic conductors deposited in and carried by an insulating layer which overlies the integrated circuits 24, 26. Thus, after having formed the conventional integrated circuit on the substrate, the upper surface 27 thereof is covered by an insulating film layer 22. The material of the insulating layer preferably comprises SiON, a well-known insulator which adheres well to GaAs, and is readily applied by known techniques such as a conventional CVD process.

Having thus deposited the film 22 on the upper surface 27 of the integrated circuit, the film is patterned and etched to produce a plurality of vias 23a. The vias 23a are then filled with conductive metal, such as silver, to form the upstanding pin-like conductors 23 illustrated in FIG. 1. The spacing of the pin-like structures 23 is adapted to be sufficiently close, and the height of the conductors above the surface 27 is adapted to be adequately high so that electromagnetic radiation which could be transmitted from one of the circuits 24 to the other 26 is effectively blocked. With respect to spacing, the pin-like conductors 23 have a spacing density substantially less than a wavelength of the operating frequency of the circuits. With respect to height, the height of the pin-like conductors 23 can be like that of the walls 7 of FIG. 6, such as 0.01 to 0.1 wavelengths of the operating frequency.

In the preferred practice of the invention, the individual conductors 23 are only about 100 square microns in cross sectional area. It will thus be appreciated that without the supporting film 22 it would not be possible to maintain the linear shield 30 in place. However, using the insulating film 22 as shown in FIG. 1 and carefully etching the vias 23a, such as by dry etching or plasma etching of a film deposited from a gas mixture including silane, ammonia and $N_2O$. The plasma is usually driven with microwave energy. Having formed the vias 23a by etching, the conductors 23 are then deposited or plated in the vias as by use of electroplating techniques.

Having thus formed the conductive shield 30 linearly interposed between the circuits 24, 26, it is then necessary to apply an effective ground to the shield for the purpose of providing the desired isolation. FIG. 1 illustrates surface mounted conductors 32 deposited on top of the insulator layer 22 and in electrical contact with each of the conductive pins 23. The power supply is then connected to the electrodes 32 to supply an effective ground to the shield. However, it is preferable to utilize a ground plane for purposes of providing adequate shielding. In order to provide a ground plane, the electrodes 23 can be extended to cover the entire surface of the insulator 22. As a preferred alternative, however, the vias 23a are extended as at 23b through the substrate 21 so that they penetrate the lower surface 28 of the substrate. A ground plane electrode 29 deposited on the lower surface 28 thus forms not only a ground plane for the overall circuit, but also a conductive interconnection between the individual pin-like conductors 23. The apertures 23b in the substrate are preferably formed at an early stage of device fabrication, preferably before formation of the integrated circuits 24, 26. In any event, they are preferably formed before deposition of the insulating film 22. The vias 23a are then etched into the film 22 in such a way as to assure registration between the vias 23a, 23b. Alternatively, a conductive electrode can be formed on the surface 27 of the substrate intended to interconnect conductive pins 23 and offset conductive pins in the substrate, as will be illustrated in the FIG. 4 embodiment.

These alternative techniques are available for providing electrical continuity between the pin-like conductors 23 and a ground shield, so as to provide an adequate degree of shielding between the circuits 24, 26. Among the features to be noted are the fact that the pin-like conductors 23 are at a spacing density substantially less than a wavelength of the operating frequency of the circuits, and at a height substantially greater than the metallization thickness normally encountered in integrated circuit work. That height is achieved without the necessity for use of thick, self-supporting conductors by virtue of the supporting and positioning insulating film. The insulating film provides yet another advantage in providing a higher dielectric constant than the air which normally surrounds such a circuit. The higher dielectric constant provides a retarding medium for propagation of electromagnetic interference between circuits 24 and 26, thus allowing those circuits to be positioned closer together. Thus, the overall circuit can be miniaturized by virtue of the fact that both of the integrated circuits 24, 26 are formed on the same substrate (and thus separate diced substrates need not be utilized), along with the further benefit of the dielectric medium surrounding the circuits which provides a further phase delay to the interference.

When the device of FIG. 1 is used in the microwave frequency range at a working frequency of about 30 gHz.., the effective wavelength at that frequency in the SiON film 22 is about 0.3 centimeters. As noted above, the pin-like conductors 23 are approximately 100 square microns in cross-sectional area, and when they are displaced on about 100 micron centers, it will be appreciated that they are at a density which is substantially greater than the wavelength of the operating frequency in the insulator. In the implementation being discussed, the film thickness 22 can be about 500 microns, and thus it will be appreciated that the pin-like conductors 23 will rise above the surface 27 by about that dimension, i.e., by about 500 microns. In such a structure, the circuits 24, 26 will be almost completely shielded from each other at the 30 mHz. operating frequency, thus preventing mutual interference between those circuits. The basis for the functionality of the pin-like conductors 23 in providing such shielding relates to the effect of mesh-type grounding electrode patterns, in which a mesh having pattern openings smaller than a wavelength presents an effective electromagnetic shield. Utilizing that analogy, it will be appreciated that the pin-like linear conductors 23 which are electrically interconnected as described above serve as a grounding conductor wall in the microwave band separating the circuits 24, 26.

Summarizing the advantages of the circuit of FIG. 1, first of all, the assembly procedures associated with the device of FIG. 6 are avoided. The circuits 24, 26 can be more closely spaced because of their formation on a single substrate, and the fact of the dielectric cover. The elimination of external conductive structures does away with the possibility of cavity resonance, and the size, weight and cost of the device will be reduced as a result of these features.

Comparing the characteristics to the prior art device of FIG. 7, it will be recalled that the FIG. 7 device is ineffective in blocking radiated interference as a result of the thickness limitation on the surface deposited grounding strips. The device of FIG. 1 does not have such a limitation because, although the conductive structures which form the shield are formed by conventional microelectronic techniques, they are disposed in such a fashion as to allow a substantial projection of those conductors above the upper surface of the integrated circuit substrate, thus achieving the desired degree of isolation.

Figure 2:
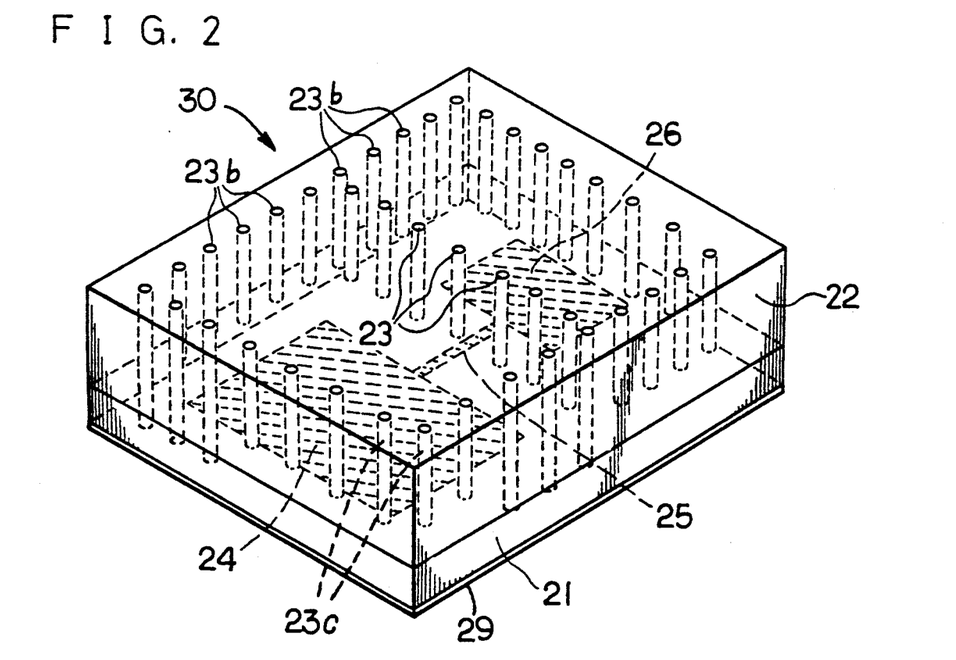
FIG. 2 is a perspective view of a semiconductor device illustrating a variation of the embodiment of FIG. 1.

FIG. 2 is similar to the structure of FIG. 1 except for the pattern of the shielding elements separating the circuit. In addition to a linear shield 30 disposed between the circuits 24, 26, the FIG. 2 embodiment also includes additional pin-like conductors 23c which are disposed to substantially surround the respective circuits, providing additional shielding not only from circuit-to-circuit but also from outside devices. The FIG. 2 embodiment illustrates that the pattern of conductive shielding members is adaptable to whatever configuration is useful for the circuit, from the simple linear structure disposed between potentially interfering circuits as shown in FIG. 1, to a completely surrounding condition as shown in FIG. 2, to whatever intermediate level of shielding might be required. The degree of complexity for the respective circuits is not great as all of the vias 23a can be formed at the same time, and all of the conductors 23 can be plated into the vias at the same time.

It is noted that the grounding techniques illustrated in connection with FIG. 1 are also applicable to the embodiment of FIG. 2 but are not illustrated in detail in that drawing in order to avoid overcomplicating the figure. Some of the vias, however, are shown as penetrating the substrate to the ground plane 29 in order to illustrate that the grounding techniques described in connection with FIG. 1 also apply to FIG. 2.

Figure 3:
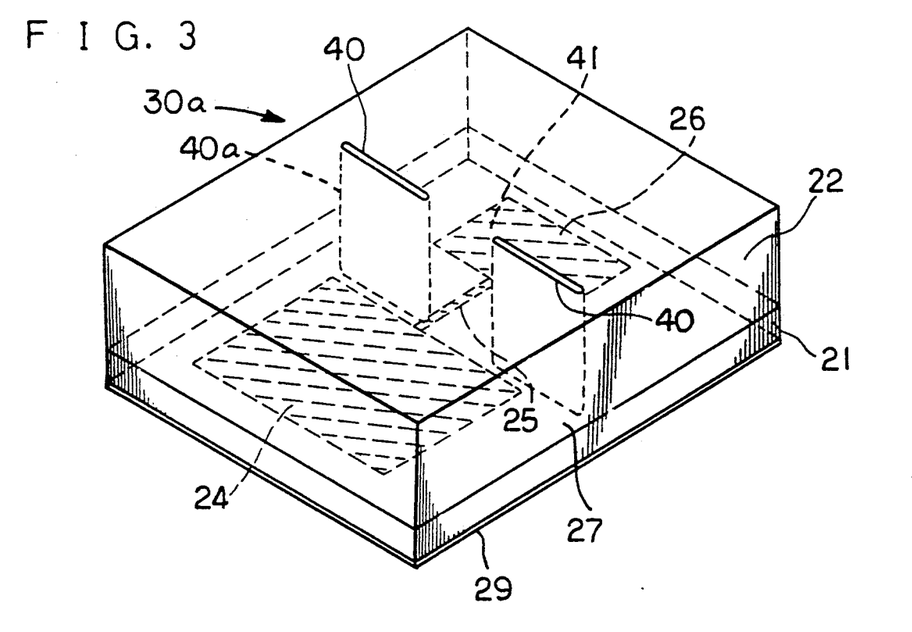
FIG. 3 is a perspective view illustrating an alternative embodiment of the present invention.

Turning then to FIG. 3, there is shown an alternative embodiment of shielding means constructed in accordance with the invention. The embodiment of FIG. 3 achieves many of the advantages of the preferred embodiment of FIG. 1, such as the highly efficient shield interposed between the circuits 24, 26. However, the embodiment of FIG. 3 raises the possibility of cracking of the crystal during formation of the shield as will be described below.

The FIG. 3 embodiment is similar to FIG. 1 except that the linear shield 30a is formed not of individual pin-like conductors, but of ribbon-like conductors 40 interposed along the line 30a, and having a gap 41 where necessary to allow for passage of a conductor 25 between the circuits. As in the FIG. 1 embodiment, the conductors 40 are formed in an insulating film 22 which is first patterned and etched to form apertures 40a in the film which descend substantially to the surface of the substrate. After formation of the apertures 40a, conductive metal electrodes are then plated into the apertures. It is seen that the metallic structure of FIG. 3 comprises a three-dimensional conductive strip having a length which defines the line 30a between the circuits 24, 26 and a width which is substantially normal to the surface 27 of the substrate. The thickness of the strip-like conductors (in the direction substantially parallel to the surface of the insulating film 22) is comparatively small as compared to the other strip dimensions, and thus produces a metallic shielding structure which would, but for the presence of the supporting insulating film 22, be non-self-supporting. However, due to the presence of the insulating film 22 and the manner in which the conductors 40 are formed therein, the shielding structure is provided with the necessary mechanical stability while providing the mechanical and electrical advantages discussed above. The main disadvantage of the FIG. 3 embodiment, as contrasted with FIG. 1, is the possibility of forming cracks either in the substrate or in the insulating film 22 during the process of etching the apertures 40a. That problem relates to the difficulty of forming a large via hole wall in a relatively thin substrate, but in cases where the strip-like conductor is desired, the processing techniques can take account of the difficulty in order to form the desired conductor shape.

Figure 4:
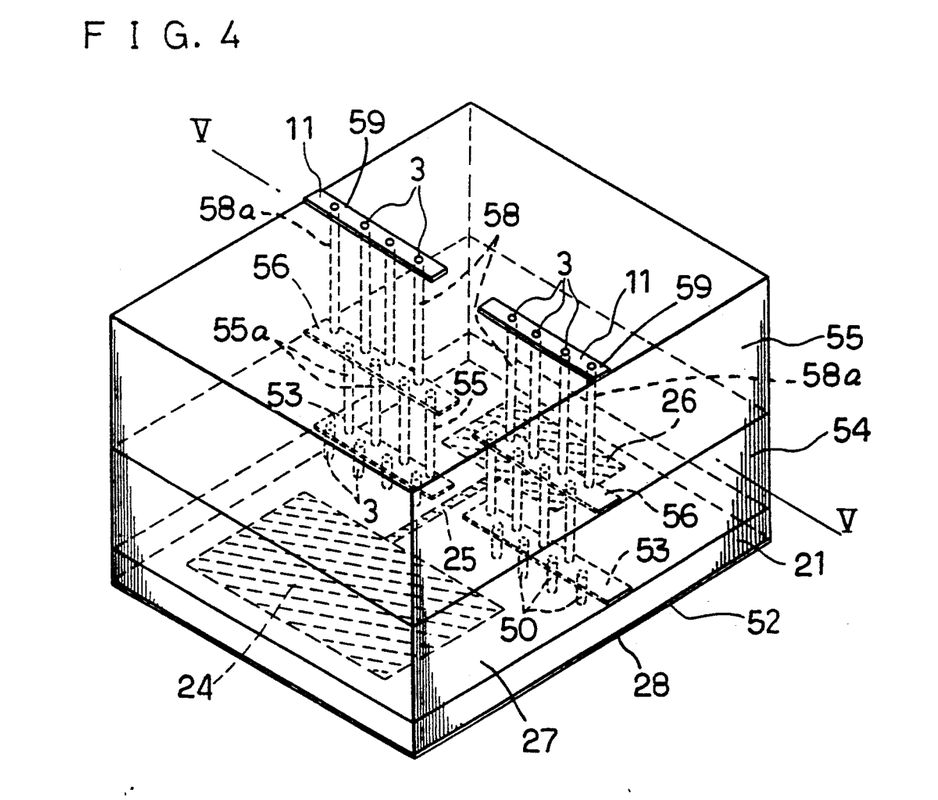
FIG. 4 is a perspective view illustrating yet another alternative embodiment utilizing multiple insulating layers and multiple shielding means.

FIG. 4 shows yet another embodiment of the present invention which, like the previous embodiments, begins with a semiconductor substrate 21 such as GaAs on which are formed a pair of integrated circuits 24, 26 connected by a conductor 25. In contrast to the other embodiments, the embodiment of FIG. 4 (and the related FIG. 5) has a multiple layer structure for providing the desired shielding. In common with the FIG. 1 embodiment, vias 50a are formed in the substrate 21 and plated to carry an array of pin-like conductive structures 50 interposed in the substrate 21. A ground plane 52 is formed on the lower surface 28 of the substrate 21 and is in electrical contact with all of the pin-like conductors 50 which penetrate the substrate. Patterned conductors 53 are formed on the upper surface of the substrate to interconnect the pins 50. Disposed atop the upper surface 27 of the substrate are a pair of insulator film layers 54, 55, in the illustrated embodiment each carrying shielding conductors, and illustrating further features of the invention. The first layer 54 is disposed directly on the upper surface 27 of the substrate and overlies the integrated circuits 24, 25, as well as the conductive patterns 53. As in the FIG. 1 embodiment, after deposition of the insulator layer 54, the layer is patterned for formation of a series of vias, in the FIG. 4 embodiment a linear array of vias 55a disposed between the integrated circuits 24, 26. Having thus patterned and etched the vias 55a, plating techniques are utilized to form pin-like conductors 55 in the vias 55a as described in connection with the previous embodiments. The spacing and height of the pin-like conductors conform to the requirements discussed above. The FIG. 4 and FIG. 5 embodiment illustrates a further patterned conductor 56 formed intermediate the insulator layers 54, 55 and adapted to provide a further electrical interconnection between the pin-like conductors 55. The patterned conductors 56 are formed by depositing and patterning a conductive film, such as sputtering or thin film deposition techniques followed by a liftoff process for patterning.

Figure 5:
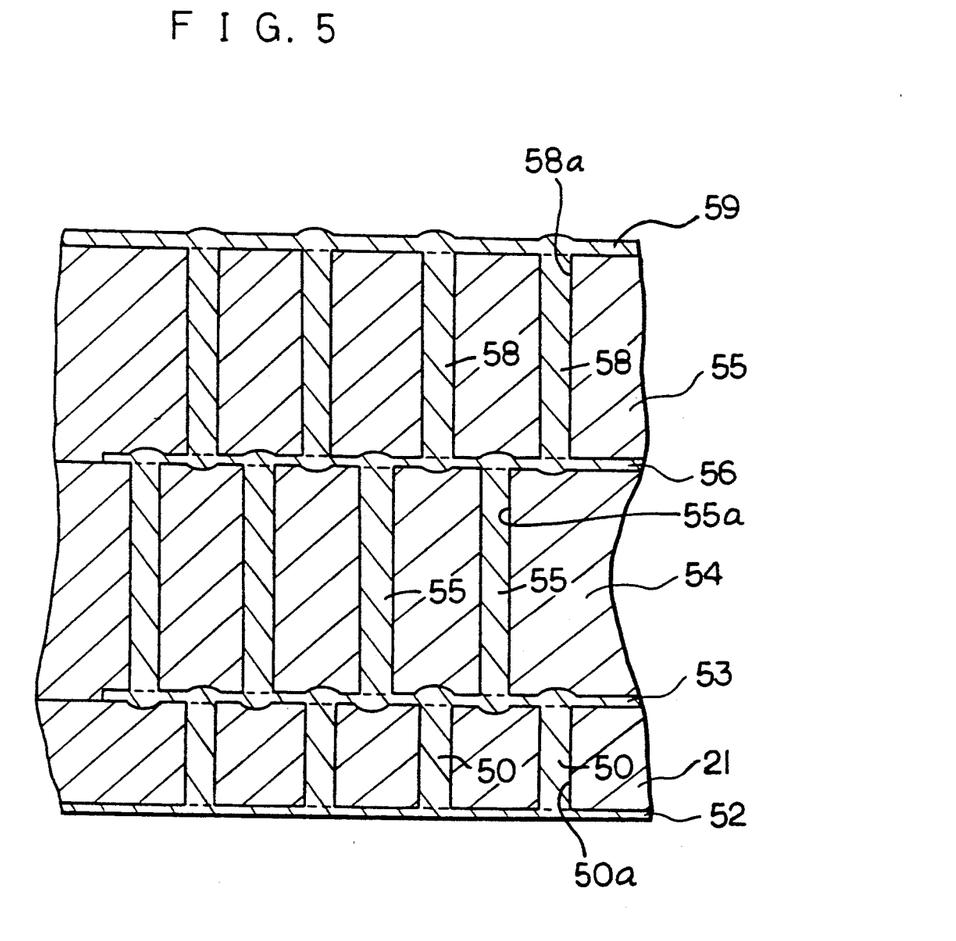
FIG. 5 is a partial sectional view taken along the line 5—5 of FIG. 4 showing a multiple layer shielding means with interconnections.

Having thus formed the intermediate conductors 56, a further layer of insulator film 55 is deposited to thus sandwich the conductors 56 intermediate the layers 54, 55. Similar techniques are then utilized to etch a further series of vias 58a in the film layer 55, then to deposit metallic conductors 58 in the etched vias. The device is completed by forming further patterned electrodes 59 atop the insulator 55 to electrically interconnect the pin-like conductors 58.

It will be appreciated from FIG. 4 and even more clearly from FIG. 5 that the respective layers of pin-like conductors are offset with respect to each other and electrically interconnected by the surface patterned electrodes formed intermediate the layers of the film. The embodiment of FIG. 4 and FIG. 5 allows the provision of shielding means of adequate height without the necessity for imposing severe restrictions on the etching process. More particularly, it can be found to be difficult to etch very thin vias through the insulator layers while maintaining the desired shape of the vias and preventing broadening of the vias at their base. The utilization of multiple very thin layers 54, 55 (whose thickness can be considered to be exaggerated in FIGS. 4 and 5) allows the requirements on the etching process to be reduced. In effect, thin insulator layers can be patterned and etched, following which the conductors can be formed in the vias and on the surface. Following completion of one layer, a subsequent layer can be patterned, etched and conductivized in order to build up to the necessary thickness to provide adequate shielding in the space over the surface of the substrate. That can be accomplished without the necessity for etching a single thick layer of insulating film, according to the embodiment of FIGS. 4 and 5. The overall electrical result of the two structures is similar, but the tradeoff is in the production process. Whereas the production process for the embodiment of FIG. 1 is simple in the sense of requiring only a single etching and plating operation, the requirements on the etching process can be rather severe because of the thickness of the single layer which must be etched. By way of contrast, while the FIG. 4 and 5 embodiment requires multiple etching and plating operations, the requirements on the individual etching steps are reduced in that the thickness of the insulator layers can correspondingly be reduced.

The patterning of the pin-like conductors in an offset fashion as best illustrated in FIG. 5 allows the formation of the pin-like conductors in a given layer to proceed without substantial influence from pin-like conductors in the levels below it. In addition, it will be appreciated that the patterning prior to etching of the respective layers is not rendered particularly difficult insofar as registration is concerned in that the insulator material which forms the layers 54, 55 is transparent to light of some defined wavelength, even if not visible light, so that the conductors can be "seen" through the insulator, allowing accurate registration of subsequently deposited masks for etching of subsequently formed vias.

The features illustrated in the foregoing embodiments are not intended to be mutually exclusive. For example, the patterning of the shielding illustrated in FIG. 2 can be applied to any of the embodiment including those shown in FIGS. 4 and 5. The strip-like electrodes of FIG. 3 can be utilized in the other embodiments if desired. Although the number of insulator films shown in the embodiments is either 1 or 2, additional layers can be utilized when desired.

Although it is preferred to utilize a semiconductor substrate such as GaAs for the substrate 1, in some embodiments a dielectric substrate such as alumina or sapphire may also be employed.

It will thus be appreciated that what has been provided is a shielding mechanism for a microwave integrated circuit which is more compatible with the semiconductor fabrication processes than the assembly techniques utilized in connection with FIG. 6, and more effective than the surface mounted conductors of FIG. 7. An insulator film is formed over the substrate and overlying the integrated circuits to be isolated. Conductive shielding means is then embedded in and thus carried by the insulator film. The conductive shielding means defines a line separating the integrated circuits to be shielded. The shielding means has spacing density and height above the substrate capable of blocking electromagnetic radiation. The radiation is blocked due in part to the spacing and configuration of the shielding means and also by virtue of the application of an effective ground to the shielding means, such as by conductors deposited on the insulator films or a ground plane applied to the lower surface of the semiconductor substrate.

The disclosed embodiments include the pin-like conductive structures supported in and carried by the insulator film, a blade-like structure which can also be incorporated in and carried by the insulator film, or multiple level devices which can be formed to produce similar electrical results. In all cases, the insulator films allow the use of very fragile conductors while providing the mechanical integrity needed for microwave circuit fabrication, allowing the devices to be substantially miniaturized but without the danger of deteriorating characteristics which would result from high frequency interference.

What is claimed is:

1. A semiconductor device comprising:
   a substrate,
   at least two integrated circuits adapted for operation at high frequencies, formed on a planar surface of the substrate, the integrated circuits being disposed such that electromagnetic radiation can be transmitted between the integrated circuits through a coupling region above the planar surface and cause electromagnetic coupling of the integrated circuits,
   an insulator film on the substrate, the insulator film overlying the integrated circuits and extending in the direction normal to the planar surface of the substrate to a substantial height above the planar surface to occupy the coupling region,
   conductive shielding means embedded in the insulator film and extending into the coupling region, the shielding means being oriented in a direction substantially normal to the surface of the substrate and being supported in the insulator film, the shielding means being disposed along a line separating the two integrated circuits for blocking the electromagnetic radiation that can be transmitted in the coupling region, the shielding means having a spacing density along the line separating the integrated circuits and extending into the coupling region to a height above the planar surface adapted to block electromagnetic radiation that can be transmitted between the integrated circuits,
   means for applying an effective ground to the shielding means for providing an electromagnetic shield between the integrated circuits,
   wherein the shielding means comprises a plurality of upstanding pin-like conductors embedded in the insulator film, the upstanding pin-like conductors being oriented in a direction substantially normal to the surface of the substrate and being disposed along the line separating the integrated circuits, the pins having a spacing along the line separating the integrated circuits substantially smaller than a wavelength of the operating frequency of the integrated circuits, the pins extending into the coupling region to a height above the planar surface adapted to block said electromagnetic radiation.

2. The combination as set forth in claim 1 wherein the insulator film is a multiple layer film disposed on the surface of the substrate, the layers of the insulator film overlying the integrated circuits and extending in the direction normal to the planar surface into the coupling region to a substantial height above the planar surface, metal wiring patterns being formed between respective layers of the insulator film and interconnecting the shielding means embedded in the respective layers, the shielding means being discontinuous and formed in the respective layers of the insulator film and electrically connected by the metal wiring patterns.

3. The combination as set forth in claim 2 wherein the shielding means comprises a plurality of pin-like conductors embedded in and carried by the respective layers of the insulator film.

4. The combination as set forth in claim 2 further including a conductive ground plane on a surface of the substrate opposite said planar surface, and means electrically interconnecting the shielding means to the ground plane.

5. The combination as set forth in claim 4 wherein the interconnecting means comprises a plurality of pin-like conductors penetrating the substrate and electrically connected between the shielding means and the ground plane.

6. The combination as set forth in claim 2 wherein the insulator film comprises a plurality of insulator film layers, the shielding means comprising upstanding pin-like conductors penetrating the respective insulator layers, and the shielding means including conductive interconnection means formed on at least one of the insulator film layers and electrically interconnecting the pin-like conductors penetrating the respective insulator layers.

7. The combination as set forth in claim 6 wherein the upstanding pin-like conductors in the respective insulator film layers are offset one with respect to each other such that at junctions between the insulator film layers the upstanding pin-like conductors are not superimposed, and the shielding means includes conductive interconnecting means disposed intermediate the insulator film layers for electrically interconnecting the offset pins at the junction of said layers.

8. The combination as set forth in claim 2 wherein the conductive shielding means further defines a pattern surrounding at least one of the integrated circuits for providing additional shielding for said one integrated circuit.

9. A semiconductor device comprising:
 a substrate,
 at least two integrated circuits adapted for operation at high frequency formed on a planar surface of the substrate, the integrated circuits being disposed such that electromagnetic radiation can be transmitted between the integrated circuits through a coupling region above the planar surface and cause electromagnetic coupling of the integrated circuits,
 an insulator film on the substrate, the insulator film overlying the integrated circuits and extending in the direction normal to the planar surface of the substrate to a substantial height above the planar surface, the insulator film being disposed in the coupling region,
 an array of pin-like conductors disposed along a shielding line between the integrated circuits, the pin-like conductors being embedded in and supported above the planar surface of the substrate in the coupling region by the insulator film, the pin-like conductors being oriented in a direction substantially normal to the surface of the substrate so as to be in intersect paths for transmission of electromagnetic radiation in the coupling region between the two integrated circuits, the pin-like conductors having a spacing between pins which is substantially less than the wavelength of the operating frequency of the integrated circuits, and extending into the coupling region to a height above the planar surface adapted to block the electromagnetic transmission between the integrated circuits, and
 means for applying an effective ground to the pin-like conductors for providing an electromagnetic shield between the integrated circuits.

* * * * *